United States Patent
Mochikawa et al.

(10) Patent No.: US 9,257,248 B2
(45) Date of Patent: Feb. 9, 2016

(54) SEMICONDUCTOR SWITCH AND POWER CONVERSION APPARATUS

(71) Applicants: Hiroshi Mochikawa, Hachioji (JP); Atsuhiko Kuzumaki, Kodaira (JP); Junichi Tsuda, Inagi (JP); Yushi Koyama, Fuchu (JP)

(72) Inventors: Hiroshi Mochikawa, Hachioji (JP); Atsuhiko Kuzumaki, Kodaira (JP); Junichi Tsuda, Inagi (JP); Yushi Koyama, Fuchu (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 475 days.

(21) Appl. No.: 13/685,908

(22) Filed: Nov. 27, 2012

(65) Prior Publication Data

US 2013/0134958 A1    May 30, 2013

(30) Foreign Application Priority Data

Nov. 29, 2011  (JP) ................................ 2011-260321

(51) Int. Cl.
  *H03B 1/00*  (2006.01)
  *H03K 3/00*  (2006.01)
  *H01H 47/00* (2006.01)
  *G05F 3/02*  (2006.01)
  *H03K 17/00* (2006.01)

(52) U.S. Cl.
  CPC ................. *H01H 47/00* (2013.01); *G05F 3/02* (2013.01); *H03K 17/00* (2013.01); *Y10T 307/74* (2015.04)

(58) Field of Classification Search
  CPC ............... H03B 1/00; H09K 3/00; H03K 3/00
  USPC .......................................... 327/108, 112, 427
  See application file for complete search history.

(56) References Cited

U.S. PATENT DOCUMENTS 8,089,780 B2 * 1/2012 Mochikawa et al. ........... 363/17
8,791,744 B2 * 7/2014 Takimoto et al. ............. 327/427

FOREIGN PATENT DOCUMENTS

| CN | 101632214 A | 1/2010 |
|----|---|---|
| EP | 0 880 221 A2 | 11/1998 |
| EP | 2 006 991 A1 | 12/2008 |
| EP | 2 110 934 A1 | 10/2009 |
| JP | 10-327585 A | 12/1998 |

(Continued)

OTHER PUBLICATIONS

Japanese Office Action dated Nov. 5, 2013 (and English translation thereof) in counterpart Japanese Application No. 2011-260321.
Japanese Office Action dated Mar. 25, 2014 in counterpart Japanese Application No. 2011-260321.

(Continued)

*Primary Examiner* — Hai L Nguyen
(74) *Attorney, Agent, or Firm* — Holtz, Holtz & Volek PC

(57) ABSTRACT

According to one embodiment, a switch includes a first element with a first withstand voltage, a second element whose withstand voltage is lower than the first withstand voltage, a diode which is connected between a positive electrode of the first element and a positive electrode of the second element in such a manner that a direction from the positive electrode of the second element toward the positive electrode of the first element is a forward direction and whose withstand voltage is equal to the first withstand voltage, a negative electrode of the first element and a negative electrode of the second element being connected, and a circuit configured to apply a positive voltage to the positive terminal output a pulse lower than the first withstand voltage when the first element goes off.

17 Claims, 8 Drawing Sheets

(56) References Cited

FOREIGN PATENT DOCUMENTS

| | | |
|---|---|---|
| JP | 2008-193839 A | 8/2008 |
| JP | 2010-226919 A | 10/2010 |
| JP | 2011041348 A | 2/2011 |
| JP | 2011-062039 A | 3/2011 |

OTHER PUBLICATIONS

Extended European Search Report (EESR) dated Sep. 12, 2013 (in English) issued in counterpart European Application No. 12194390.6.

Chinese Office Action dated Sep. 2, 2014, issued in counterpart Chinese Application No. 201210499766.X.

* cited by examiner

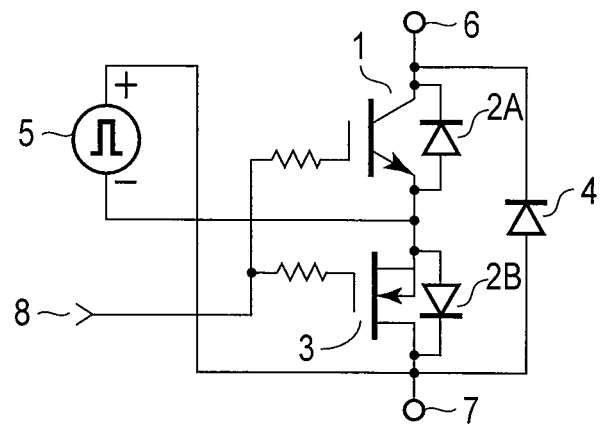
F I G. 1
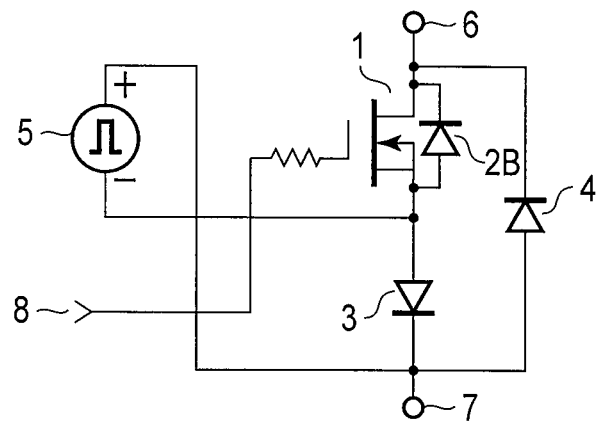
F I G. 2
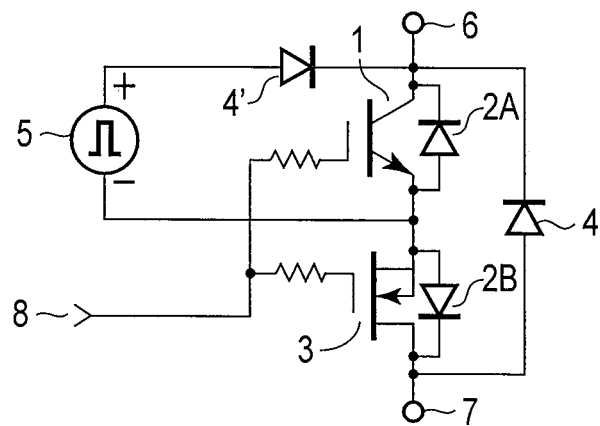
F I G. 3

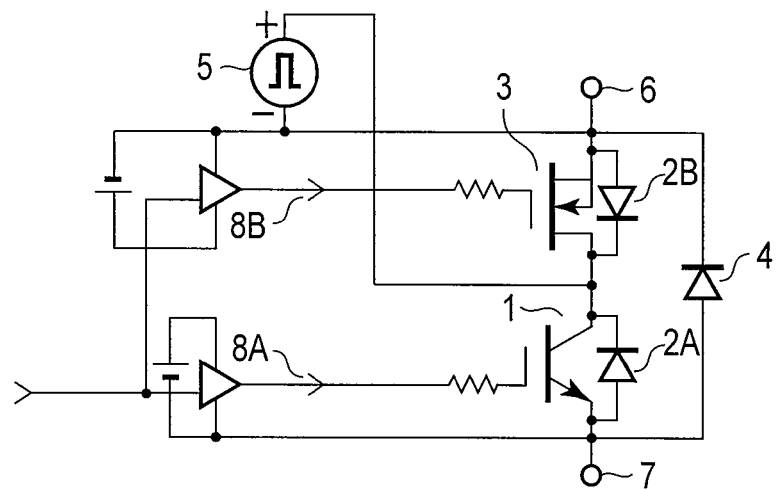
F I G. 4
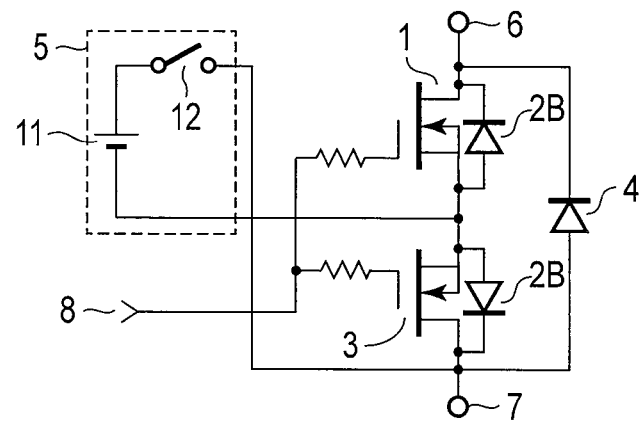
F I G. 5
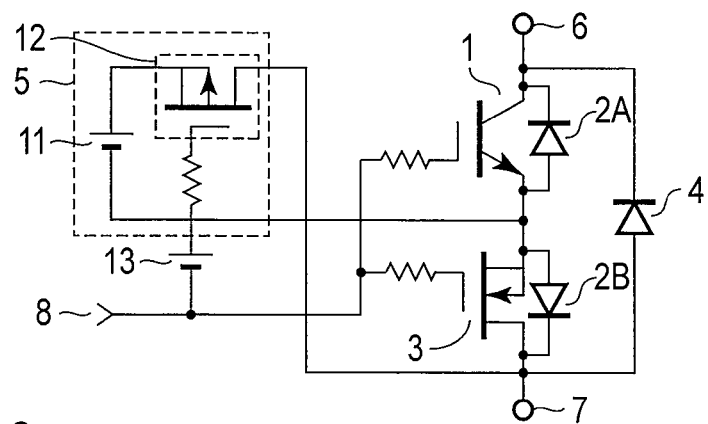
F I G. 6

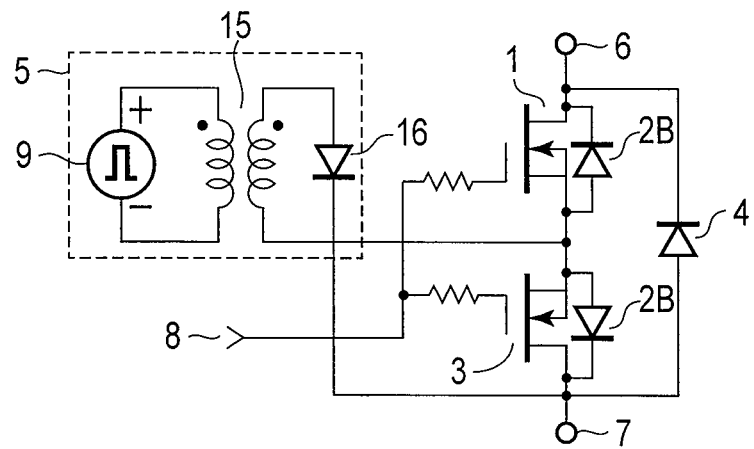
F I G. 7
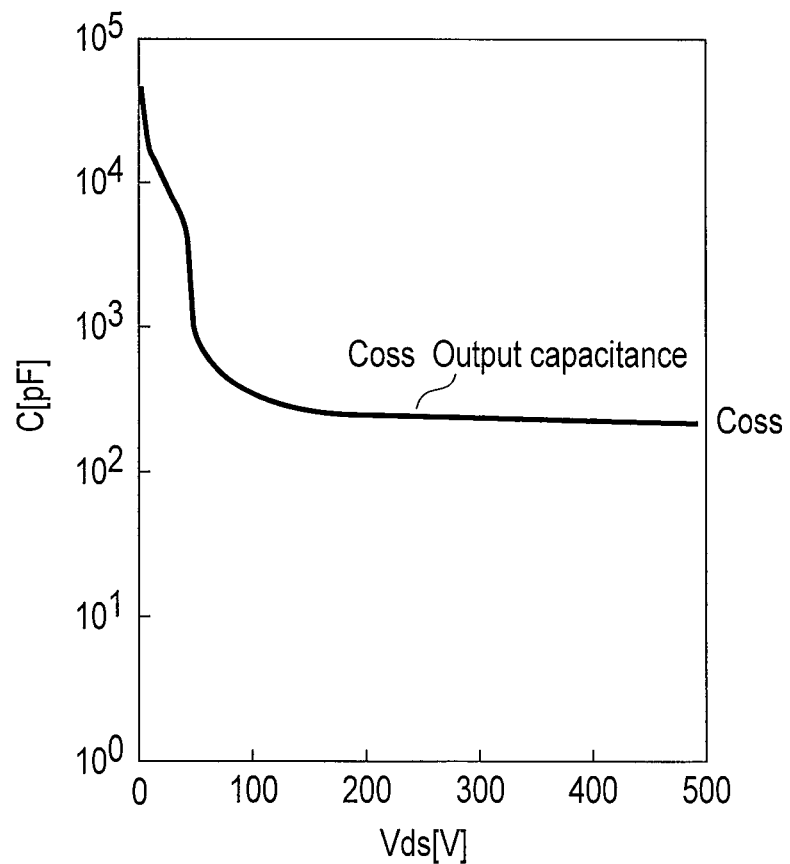
F I G. 8

SEMICONDUCTOR SWITCH AND POWER CONVERSION APPARATUS

CROSS-REFERENCE TO RELATED APPLICATIONS

This application is based upon and claims the benefit of priority from Japanese Patent Application No. 2011-260321, filed Nov. 29, 2011, the entire contents of which are incorporated herein by reference.

FIELD

Embodiments described herein relate generally to a semiconductor switch and a power conversion apparatus.

BACKGROUND

In a conventional power conversion circuit where a free-wheeling diode is connected in inverse parallel to a switching element in a main circuit, what have been desired are a semiconductor switch that decreases a loss caused by the flow of a reverse recovery current in the free-wheeling diode and a power conversion apparatus that includes the semiconductor switch.

In a semiconductor switch where a high-speed free-wheeling diode is connected in inverse-parallel to a switching element, when a main current is flowing in the reverse direction, if the semiconductor switch is turned off (or when a main element and an auxiliary element are turned off), the voltage remaining between both ends of the main element is determined by the product of the inductance value of a circuit loop that connects the main element, auxiliary element, and high-speed free-wheeling diode and the magnitude of the main current. To make faster the switching speed of the semiconductor switch, it is necessary to make the inductance of the circuit loop as low as possible. Therefore, the voltage remaining in the main element sometimes dropped as low as below several voltages.

Here, it is necessary to consider the output capacitance of the main element when the element is off. For instance, such a semiconductor switching element has the property of including a very large capacitance if the residual voltage applied to the element in the off state is low. The reason is that the depletion layer at the junction part is thin when the output terminal voltage is low and therefore the element has a very large capacitance.

When the capacitance is very large, if one semiconductor switch that operates complementarily is turned on in a bridge circuit composed of two semiconductor switches connected in series in a direct-current main circuit, a charging current will flow toward the large capacitance. Since the circuit impedance is very low, the charging current might become a large current as in a short circuit, causing a large loss.

BRIEF DESCRIPTION OF THE DRAWINGS

FIG. 1 schematically shows a configuration of a semiconductor switch according to a first embodiment;

FIG. 2 schematically shows another configuration of the semiconductor switch according to the first embodiment;

FIG. 3 schematically shows still another configuration of the semiconductor switch according to the first embodiment;

FIG. 4 schematically shows a configuration of a semiconductor switch according to a second embodiment;

FIG. 5 schematically shows a configuration of a semiconductor switch according to a third embodiment;

FIG. 6 schematically shows a configuration of a semiconductor switch according to a fourth embodiment;

FIG. 7 schematically shows a configuration of a semiconductor switch according to a fifth embodiment;

FIG. 8 shows an example of the capacitance characteristic of a super-junction MOSFET;

DETAILED DESCRIPTION

Figure 9:
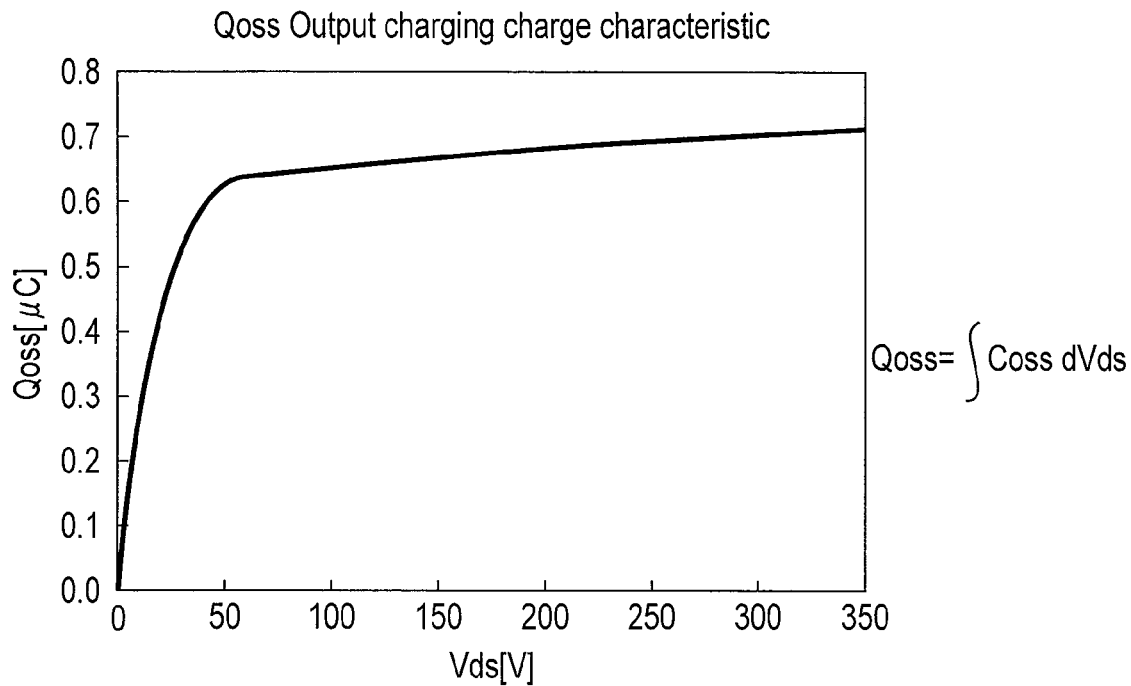
FIG. 9 shows an example of the output charging charge characteristic of the super-junction MOSFET.

In general, according to one embodiment, a semiconductor switch comprises a main element which has an inverse conducting capability and is a voltage driving switching element with a high withstand voltage; a backflow prevention element whose withstand voltage is lower than that of the main element; a high-speed free-wheeling diode which is connected between a positive terminal and a negative terminal in such a manner that a direction from the negative terminal toward the positive terminal is a forward direction and which has a withstand voltage equal to that of the main element, a negative electrode of the main element and a negative electrode of the backflow prevention element being connected to each other, a positive electrode of the main element being used as the positive terminal, and a positive electrode of the backflow prevention element being used as the negative terminal; and an auxiliary voltage applying circuit which is connected in a direction in which a positive voltage is applied to the positive electrode of the main element and which generates at least a voltage pulse lower than the withstand voltage of the main element and outputs the voltage pulse almost in synchronization with the time when main element goes off.

Hereinafter, a semiconductor switch according to an embodiment will be explained with reference to the accompanying drawings.

FIG. 1 schematically shows a configuration of a semiconductor switch according to a first embodiment. The semiconductor switching of the first embodiment comprises a main element 1, an auxiliary element 3 acting as a backflow prevention element, a high-speed free-wheeling diode 4, and an auxiliary voltage applying circuit 5.

The main element 1 is a voltage driving switching element. For example, an Insulated Gate Bipolar Transistor (IGBT) with a withstand voltage of 600 V can be used as the main element. An inverse conducting diode 2A is connected in inverse parallel to the IGBT, thereby achieving an inverse conducting capability. The withstand voltage of the main element 1 is a realizable voltage equal to preferably 100 V or higher, much preferably 200 V or higher, and most preferably 250 V or higher. Normally, an element with a withstand voltage of 250 V or higher is used.

The auxiliary element 3 is a voltage driving switching element. For example, a Metal-Oxide-Semiconductor Field-Effect Transistor (MOSFET) with a withstand voltage of 50 V can be used as the auxiliary element. The auxiliary element 3 has a lower withstand voltage than that of the main element 1. Using a MOSFET with a sufficiently low withstand voltage as the auxiliary element 3 enables the conduction resistance of the auxiliary element to be made lower and a semiconductor chip of the auxiliary element 3 to be made smaller. It is generally known that the conduction resistance of the MOSFET is proportional to the withstand voltage to the two and one-half power. Lowering the withstand voltage of the auxiliary element 3 makes it possible to achieve a decrease in the conduction resistance (a decrease in the conduction loss) and a decrease in the chip area (cost reduction) at the same time.

The high-speed free-wheeling diode 4 has the same withstand voltage as that of the main element 1, for example, a withstand voltage of 600 V. The high-speed free-wheeling diode 4 is smaller in chip area than the inverse conduction diode 2A connected in inverse parallel to the main element 1. In addition, the high-speed free-wheeling diode 4 has a larger voltage drop in the forward direction, but is superior in reverse recovery. It is all right if the high-speed free-wheeling diode 4 has a withstand voltage equal to or higher than that of the main element 1. The high-speed free-wheeling diode 4 is not limited to a diode with the same withstand voltage. In addition, the diode has the property of generally getting worse in the reverse recovery characteristic as the withstand voltage becomes higher. Therefore, the high-speed free-wheeling diode 4 may be configured to have a high-speed reverse recovery and be composed of low-withstand-voltage diodes connected in series. Although a voltage drop increases at the time of conduction, the main current flows in the high-speed free-wheeling diode 4 only during a dead time period when the main current flows from a negative terminal 7 toward a positive terminal 6. Therefore, its conduction interval is short and therefore the increased conduction loss is a little.

In addition, the high-speed free-wheeling diode 4 may be composed of a diode made of a semiconductor material whose forbidden band is wider than that of silicon (e.g., silicon carbide, gallium nitride, gallium arsenide, or diamond). Using a diode made of a semiconductor material whose forbidden band is wider than that of silicon enables a higher withstand voltage, high-speed reverse recovery characteristic to be obtained. Although a semiconductor material with a wider forbidden band is more expensive than silicon semiconductor, the cost of the high-speed free-wheeling diode 4 can be kept lower because the high-speed free-wheeling diode 4 conducts only during a short dead time, achieving a small chip area.

The auxiliary voltage applying circuit 5 is connected in parallel to the auxiliary element 3 in a direction in which a positive voltage is applied to the positive electrode of the auxiliary element 3. For example, when the main element 1 goes off later than the auxiliary element 3 goes off, the auxiliary voltage applying circuit 5 outputs a voltage pulse lower than the withstand voltage of the auxiliary element 3, for example, a 30-V voltage pulse, in synchronization with the time that a gate driving signal of the main element 1 goes off.

The negative electrode, or the emitter, of the main element 1 is connected to the source terminal of the auxiliary element 3. The positive electrode, or the collector, of the main element 1 is used as a positive electrode terminal 6. The drain terminal of the auxiliary element 3 is used as a negative terminal 7. The high-speed free-wheeling diode 4 is connected in parallel to the main element 1 and auxiliary element 3 in a direction from the negative terminal 7 to the positive terminal 6.

Each of the gate terminal of the main element 1 and that of the auxiliary element 3 is connected via a suitable gate resistance to a gate driving voltage 8 common to the gate terminals. The gate driving voltage 8 is configured to be applied via the gate resistances connected to the gate terminals of the main element 1 and auxiliary element 3 and turned on and off in synchronization with the main element 1 and auxiliary element 3.

In the first embodiment configured as described above, when a main current is flowing in the opposite direction, that is, in a direction from the negative terminal 7 toward the positive terminal 6, the main current is flowing in this path: negative terminal 7→auxiliary element 3→inverse conducting diode 2A→positive terminal 6. At this time, when the main element 1 and auxiliary element 3 are turned off, the auxiliary element 3 going off causes the main current to flow in the following path: negative terminal 7→high-speed free-wheeling diode 4→positive terminal 6. Therefore, the main current changes the flowing path from the former to the latter after a specific time has elapsed since the auxiliary element 3 was turned off. When the auxiliary voltage applying circuit 5 has output a 30-V pulse at the time of the switching of the flowing paths, the 30-V pulse voltage is applied between the collector and emitter of the main element 1 because the high-speed free-wheeling diode 4 is conducting. At this time, the pulse voltage drops slightly by the forward voltage of the high-speed free-wheeling diode 4 (normally 1 to 2 V). Therefore, about a voltage of 28 to 29 V is applied to the output terminal of the main element 1.

In addition, the 30-V pulse voltage is also applied to the output of the auxiliary element 3. In the meantime, the power output from the auxiliary voltage applying circuit 5 is limited to what is needed to charge the output terminal voltages of the main element 1 and auxiliary element 3 and is not supplied to an external main circuit, thereby achieving the less output power.

It is known that a high-withstand-voltage main element presents the property of its output junction capacitance decreasing rapidly when a voltage sufficiently lower than a main circuit voltage is just applied to the element. A voltage of about 28 to 29 V has been applied to the main element 1 and therefore the output junction capacitance of the main element 1 has become lower, making it possible to suppress a large current as in a short circuit when the other semiconductor switch operating complementarily is turned on.

On the other hand, when the main current is flowing in the forward direction, that is, in a direction from the positive terminal 6 toward the negative terminal 7, if the main element 1 and auxiliary element 3 are turned off, the main element 1 will shut off the current and therefore a main voltage (normally about 200 V to 400 V) is applied between both ends of the main element 1 the instance the main element is turned off. In this case, even if the auxiliary voltage applying circuit 5 generates a 30-V voltage pulse, the pulse is sufficiently lower than the main voltage and therefore the high-speed free-wheeling diode 4 is in a reverse blocking state, preventing a charging current from flowing from the auxiliary voltage applying circuit 5 to the main element 1. Therefore, the power from the auxiliary voltage applying circuit 5 is used to mainly charge the auxiliary element 3 and therefore kept to a very low level.

As described above, with the first embodiment, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

FIG. 2 is a circuit diagram of a modification of the semiconductor switch. In the modification, a MOSFET including a parasitic diode 2B is used as the main element 1 and a diode is used as the auxiliary element (backflow prevention element) 3. The auxiliary element 3 is connected between the emitter of the main element 1 and the negative terminal 7, with the direction from the positive terminal 6 toward the negative terminal 7 being the forward direction. That is, when the auxiliary element 3 is a diode, its anode is connected to the negative electrode of the main element 1 and its cathode is used as the negative terminal 7.

When a MOSFET is used as the main element 1, a parasitic diode 2B will develop in the MOSFET. Therefore, connecting a diode acting as the auxiliary element 3 is effective in preventing a backflow from the negative terminal 7 to the positive terminal 6. In addition, when an IGBT is used as the main element 1, connecting a diode acting as the auxiliary element 3 for backflow prevention in adding an inverse conducting diode 2A to the IGBT produces the same effect.

The semiconductor switch of FIG. 2 has the same configuration as that of the semiconductor switch of the first embodiment except for the configuration of the auxiliary element 3. The semiconductor switch of the modification produces the same effect as that of the semiconductor switch of the first embodiment. That is, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

FIG. 3 is a circuit diagram of another modification of the semiconductor switch. In this modification, the auxiliary voltage applying circuit 5 is connected in parallel to the main element 1 via a diode (a second diode) 4' in such a manner that a positive voltage is applied to the positive electrode of the main element 1. The diode 4' is a high-withstand-voltage, high-speed diode equivalent to, for example, the high-speed free-wheeling diode 4. The diode 4' has only to have a withstand voltage equal to or higher than that of the main element 1 and is not limited to a diode that has the same withstand voltage as that of the main element. The auxiliary voltage applying circuit 5 generates a voltage pulse lower than at least the withstand voltage of the main element 1 at the time that the main element 1 and auxiliary element 3 are turned off.

The semiconductor switch shown in FIG. 3 has the same configuration as that of the semiconductor switch of the first embodiment except for the configuration of the auxiliary voltage applying circuit 5. The semiconductor switch of the modification also produces the same effect as that of the semiconductor switch of the first embodiment. That is, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

Next, a semiconductor switch according to a second embodiment will be explained with reference to the accompanying drawings. In the explanation below, a configuration that has a similar function is indicated by the same reference numeral and a detailed explanation will be omitted.

FIG. 4 is a circuit diagram schematically showing a configuration of a semiconductor switch according to the second embodiment. The semiconductor switch of the second embodiment is such that the positional relationship between the main element 1 and auxiliary element 3 connected in series is reversed in the semiconductor switch of the first embodiment. In this case, it is necessary to drive the gate of the main element 1 and that of the auxiliary element 3 at separate potentials. The gates have to be insulated by insulating means, such as a photo-coupler (not shown). In FIG. 4, the gate of the main element 1 is driven by a gate driving voltage 8A and the gate of the auxiliary element 3 is driven by a gate driving voltage 8B. The gate driving voltages 8A, 8B are output from amplifiers connected to separate direct-current voltage sources.

With a conversion circuit where a semiconductor switch of the same type is located on the high-potential side of the semiconductor switch of the second embodiment, the gate driving power supply of the main element 1 on the high-potential side can be used as the gate deriving power supply of the auxiliary element 3. The configuration excluding what has been described above is the same as that of the semiconductor switch of the first embodiment.

With the semiconductor switch of the second embodiment, too, when a main current is flowing in the opposite direction, that is, in a direction from the negative terminal 7 toward the positive terminal 6, the main current is flowing in this path: negative terminal 7→inverse conducting diode 2A→auxiliary element 3→positive terminal 6. At this time, when the main element 1 and auxiliary element 3 are turned off, the auxiliary element 3 going off causes the main current to flow in the following path: negative terminal 7→high-speed free-wheeling diode 4→positive terminal 6. When the auxiliary voltage applying circuit 5 has output a 30-V pulse at the time of the switching of the flowing paths, the 30-V pulse voltage is applied between the collector and emitter of the main element 1 because the high-speed free-wheeling diode 4 is conducting. At this time, the pulse voltage drops slightly by the forward voltage of the high-speed free-wheeling diode 4 (normally 1 V to 2 V). Therefore, about a voltage of 28 V to 29 V is applied to the output terminal of the main element 1.

In addition, the 30-V pulse voltage is also applied to the output of the auxiliary element 3. In the meantime, the power output from the auxiliary voltage applying circuit 5 is limited to what is needed to charge the output terminal voltages of the main element 1 and auxiliary element 3 and is not supplied to an external main circuit, thereby achieving the less output power.

On the other hand, when the main current is flowing in the forward direction, that is, in a direction from the positive terminal 6 toward the negative terminal 7, if the main element 1 and auxiliary element 3 are turned off, the main element 1 will shut off the current and therefore a main voltage (normally about 200 V to 400 V) will be applied between both ends of the main element 1 the instance the main element is turned off. In this case, even if the auxiliary voltage applying circuit 5 generates a 30-V voltage pulse, the pulse is sufficiently lower than the main voltage and therefore the high-speed free-wheeling diode 4 is in a reverse blocking state, preventing a charging current from flowing from the auxiliary voltage applying circuit 5 to the main element 1. Therefore, the power from the auxiliary voltage applying circuit 5 is used to mainly charge the auxiliary element 3 and therefore kept to a very low level.

As described above, with the second embodiment, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

Next, a semiconductor switch according to a third embodiment will be explained with reference to the accompanying drawings.

FIG. 5 is a circuit diagram schematically showing a configuration of a semiconductor switch according to the third embodiment. In the semiconductor switch of the third embodiment, a MOSFET (e.g., with a withstand voltage of 600 V) is used as a main element 1. The main element 1 includes a parasitic diode 2B capable of inverse conduction. An auxiliary voltage applying circuit 5 is composed of a direct-current voltage source 11 and a switch 12 connected in series. The switch 12 is, for example, a miniaturized semiconductor switch as a semiconductor switch element. The semiconductor switch of the third embodiment has the same configuration as that of the semiconductor switch of the first embodiment except for what has been described above.

In the third embodiment, applying a low-resistance MOSFET to the main element 1 causes the conduction resistance of the auxiliary element 3 to be added to the conduction resistance of the main element 1. However, selecting a sufficiently low withstand voltage of the auxiliary element 3 causes the conduction resistance of the auxiliary element 3 to be made very low as in the semiconductor switch of the first embodiment, keeping an increase in the added conduction resistance to a very low level.

In addition, when a main current flows in the opposite direction, if the main element 1 and auxiliary element 3 are in the on state, the main current will not flow in the high-speed free-wheeling diode 4 but flows in a series circuit of the low-resistance main element 1 and auxiliary element 3.

As a result, the semiconductor switch of the third embodiment can decrease a conduction loss more in conducting in the forward direction and the reverse direction than the semiconductor switch of the first embodiment where an IGBT has been applied to the main element 1.

As described above, with the third embodiment, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

Next, a semiconductor switch according to a fourth embodiment will be explained with reference to the accompanying drawings.

FIG. 6 is a circuit diagram schematically showing a configuration of a semiconductor switch according to the fourth embodiment. In the semiconductor switch of the fourth embodiment, the auxiliary voltage applying circuit 5 is composed of a direct-current voltage source 11 and a switch 12 connected in series. A p-channel MOSFET acting as a miniaturized semiconductor switch is used as the switch 12. In the explanation below, the switch 12 will be explained as a p-channel MOSFET 12.

A common gate driving voltage 8 is connected to the gate of the p-channel MOSFET 12 via a gate voltage level shifter 13 and a suitable gate resistance. Since the source potential of the p-channel MOSFET 12 is higher than the emitter potential of the main element 1 or the source potential of the auxiliary element 3 by the voltage of the direct-current voltage source 11, the gate voltage level shifter 13 is needed to adjust the gate potential by compensating for the potential difference. Therefore, the potential shift value of the gate voltage level shifter 13 is almost equal to the voltage of the direct-current voltage source 11 and determined interlocking with the voltage of the direct-current voltage source 11. The gate voltage level shifter may be composed of a combination of a capacitor and a charging circuit for the capacitor. The semiconductor switch of the fourth embodiment has the same configuration as that of the semiconductor switch of the first embodiment except for what has been explained above.

In the semiconductor switch of the fourth embodiment, the p-channel MOSFET 12 goes on when its gate potential becomes lower than its source potential. Conversely, the main element 1 and auxiliary element 3 go off when their gate potentials become low. Therefore, the p-channel MOSFET 12 goes on when the main element 1 and auxiliary element 3 go into the off state, making it possible to apply the voltage of the direct-current voltage source 11 to the main element 1 when the main element 1 goes off.

Therefore, the fourth embodiment enables the same effect of the semiconductor switch of the first embodiment to be controlled only by the common gate driving voltage 8, making it possible to simplify the configuration.

As described above, with the fourth embodiment, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

Next, a semiconductor switch according to a fifth embodiment will be explained with reference to the accompanying drawings.

FIG. 7 is a circuit diagram schematically showing a configuration of a semiconductor switch according to the fifth embodiment. In the semiconductor switch of the fifth embodiment, the auxiliary voltage applying circuit 5 includes a pulse voltage source 9 acting as a direct-current voltage source and a backflow prevention diode 16 to which a voltage is applied from the pulse voltage source 9 via an insulating transformer 15. The pulse voltage source 9 is connected to the primary circuit of the insulating transformer 15. The secondary circuit of the insulating transformer is connected in parallel to the auxiliary element 3 via a backflow prevention diode 16. The semiconductor switch of the fifth embodiment has the same configuration as that of the semiconductor switch of the third embodiment except for what has been explained above.

In the semiconductor switch of the fifth embodiment, the pulse voltage source 9 can supply power at different potentials. For example, the pulse voltage source 9 can supply power to a plurality of semiconductor switches of the same type constituting a converter from a common control power supply, which enables a power supply to be shared.

That is, the fifth embodiment not only produces the same effect as that of the semiconductor switch of the third embodiment but also enables power needed to apply an auxiliary voltage to be supplied from a common power supply, making it unnecessary to provide a separate power supply. Therefore, the configuration of the semiconductor switch can be simplified.

In addition, a common control circuit can generate a pulse voltage, making it possible to generate pulses with higher timing accuracy. Accordingly, the semiconductor switch of the fifth embodiment can generate a necessary minimum pulse voltage with the optimum timing, enabling power consumption to be reduced.

As described above, with the fifth embodiment, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

Next, an example of the characteristic of the semiconductor switch according to the third and fifth embodiments will be explained.

FIG. 8 shows an example of the capacitance characteristic of a super-junction MOSFET. FIG. 8 shows an example of the capacitance characteristic of a vertical MOSFET with a 600-V-withstand-voltage super-junction structure that can be applied to the main element 1. In FIG. 8, the horizontal axis indicates a drain-source voltage (Vds), the output terminal voltage of the main element 1, and the vertical axis indicates a capacitance value.

When attention is focused on the output capacitance (Coss), it is seen that the output capacitance has a high value near 0 V at which the output terminal voltage is very low but decreases rapidly as the output terminal voltage rises. For example, if the output terminal voltage has risen to 50 V, the output capacitance decreases to about $1/40$ of the present value. The reason for this is as follows. When the applied voltage is low, the depletion layer is still thin and therefore has a folded wide area with a super-junction structure, representing a large capacitance value. However, when the applied voltage higher than a specific potential is applied and the depletion gets thicker, the depletion layer becomes a planarized insulating surface, not a folded surface based on the super-junction structure, causing the area to decrease significantly, which causes the output capacitance to decrease substantially as described above.

FIG. 9 is a diagram representing such an output capacitance characteristic as a charge characteristic (Qoss) where the main element 1 is charged as the output voltage rises. In FIG. 9, the horizontal axis indicates a drain-source voltage (Vds), the output terminal voltage of the main element 1. The charge characteristic is obtained by integrating the capacitance characteristic of FIG. 8 with respect to Vds on the horizontal axis.

If the output capacitance does not depend on Vds and represents a constant capacitance value, the characteristic of FIG. 9 should represent a curve rising linearly from the origin. However, as seen from FIG. 9, the curve rises sharply in a region where the drain-source voltage (Vds) is low and reaches about 0.63 [μC] at 50 V. This means that 90% of charge injection has been completed on the assumption that a main circuit voltage is applied to a 280-V converter.

That is, when the main element 1 is a vertical MOSFET with a super-junction structure, just applying a low voltage enables the output capacitance to be decreased remarkably.

Therefore, in this case, the output capacitance of the main element 1 is decreased remarkably, making it possible to effectively decrease a turn-on power loss caused by a junction capacitance charging current.

Next, another characteristic of the semiconductor switch according to the third and fifth embodiments will be explained.

Figure 10:
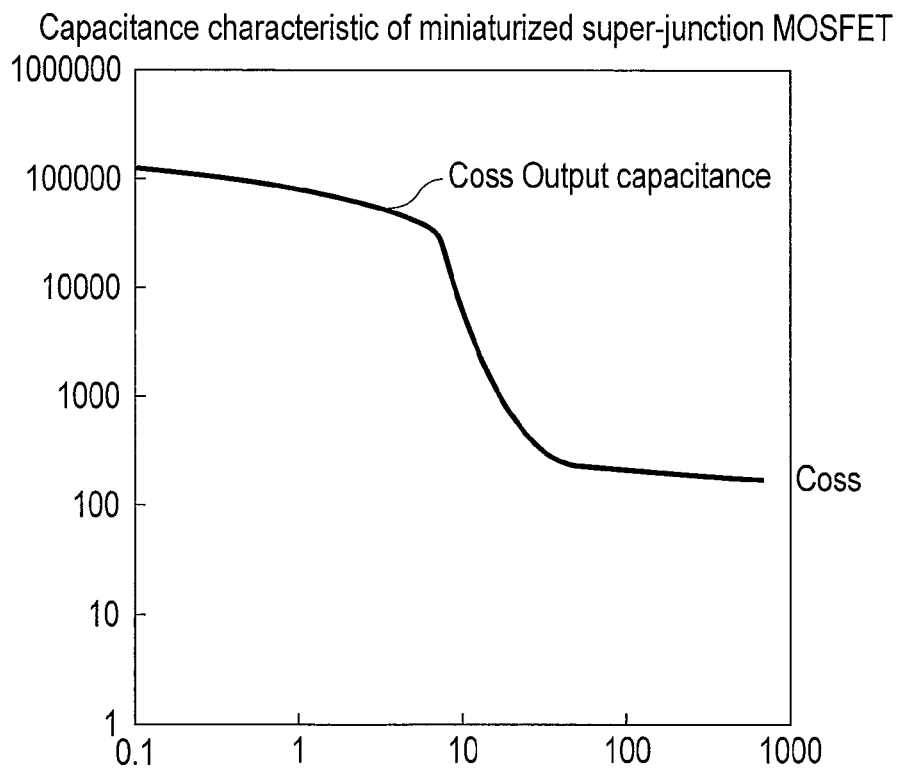
FIG. 10 shows an example of the capacitance characteristic of a miniaturized super-junction MOSFET.

FIG. 10 shows an example of the capacitance characteristic of a vertical MOSFET with a miniaturized super-junction structure. In FIG. 10, the horizontal axis indicates a drain-source voltage (Vds), the output terminal voltage of the main element 1, and the vertical axis indicates a capacitance value (on a logarithmic scale).

As compared with the output capacitance characteristic of a general super-junction MOSFET shown in FIG. 8, the characteristic curve of FIG. 10 drops sharply in a region where the drain-source voltage (Vds) is much lower. Such a characteristic is found when the aspect ratio of the super-junction structure is high. When as low a voltage (about 20 V) as about $1/30$ of the 600-V withstand voltage of the main element 1 is just applied to the output terminal, the output capacitance falls sharply to $1/100$ or less of the present value.

That is, when the main element 1 is a vertical MOSFET with a miniaturized super-junction structure, just applying a lower auxiliary voltage causes the output capacitance of the main element 1 to decrease remarkably, making it possible to effectively decrease a turn-on power loss caused by a junction capacitance charging current.

FIGS. 8 to 10 have shown an example of the characteristic of the main element 1. A MOSFET whose output capacitance decreases to $1/10$ or less of the present value when as low a voltage as $1/20$ or less of the withstand voltage is applied to the output terminal is used as main element 1 in the semiconductor switch of the embodiments, which makes it possible to effectively prevent the output capacitance of the main element 1 from increasing and suppress a turn-on power loss caused by a junction capacitance charging current.

Next, a semiconductor switch according to a sixth embodiment will be explained with reference to the accompanying drawings.

Figure 11:
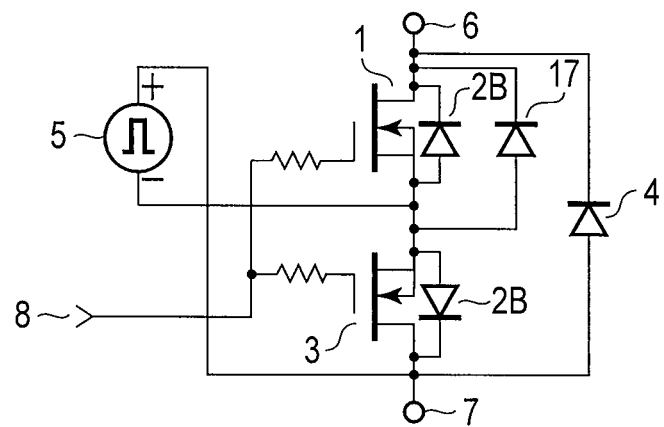
FIG. 11 schematically shows a configuration of a semiconductor switch according to a sixth embodiment.

FIG. 11 is a circuit diagram schematically showing a configuration of a semiconductor switch according to the sixth embodiment. In FIG. 11, a MOSFET (e.g., with a withstand voltage of 600 V) is applied to a main element 1. The main element 1 includes a parasitic diode 2B capable of inverse conduction. A high-speed diode 17 is connected in inverse parallel to the main element 1. The semiconductor switch of the sixth embodiment has the same configuration as that of the semiconductor switch of the third embodiment except for what has been described above.

In the semiconductor switch of the sixth embodiment, when the current value increases while the main current is flowing in the opposite direction, the on resistance of the main element 1 cannot keep the voltage drop to a sufficiently low level. In this case, if current is shunted to the parasitic diode 2B, carriers will accumulate in the parasitic diode 2B of the MOSFET, deteriorating a reverse recovery characteristic. At this time, since the auxiliary voltage applying circuit 5 has to supply extra power to discharge accumulated carriers in the parasitic diode 2B of the MOSFET.

With the configuration of the semiconductor switch of the sixth embodiment, since current is also shunted to the high-speed diode 17 connected in inverse parallel to the main element 1, the shunted current to the parasitic diode 2B of the MOSFET can be alleviated, enabling a deterioration in the reverse recovery to be reduced. As a result, the power consumption in the auxiliary voltage applying circuit 5 can be suppressed to a low level.

That is, with the semiconductor switch of the sixth embodiment, even if the inverse main current becomes larger, the supply of extra power required for reverse recovery of the parasitic diode 2B of the MOSFET acting as the main element 1 can be decreased.

With the sixth embodiment, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

Next, a semiconductor switch according to a seventh embodiment will be explained with reference to the accompanying drawings.

Figure 12:
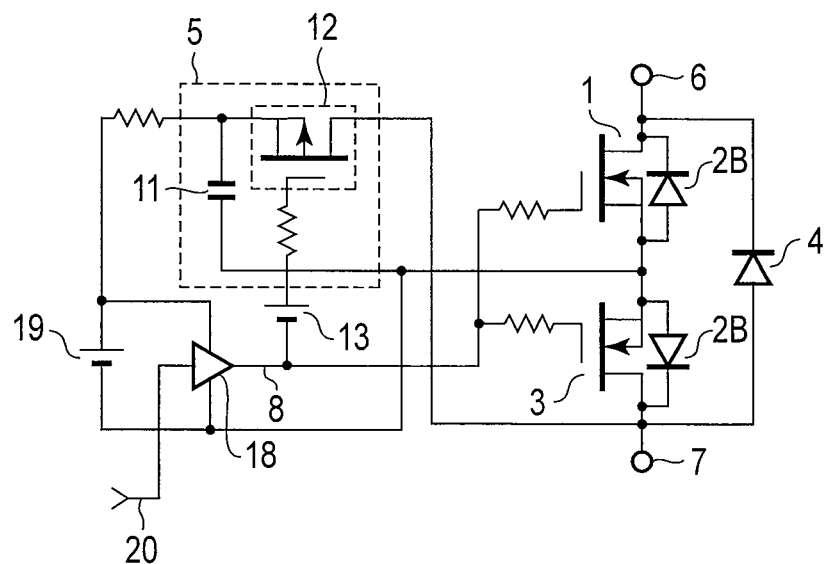
FIG. 12 schematically shows a configuration of a semiconductor switch according to a seventh embodiment.

FIG. 12 is a circuit diagram schematically showing a configuration of a semiconductor switch according to the seventh embodiment. In FIG. 12, a MOSFET (e.g., with a withstand voltage of 600 V) is applied to a main element 1. The main element 1 includes a parasitic diode 2B capable of inverse conduction.

A gate driving amplifier 18 receives a gate control signal 20, amplifies current, and outputs a gate driving voltage 8. Its power is supplied from a gate driving power supply 19. The gate driving power supply 19 also supplies power to a direct-current voltage source 11 of the auxiliary voltage applying circuit 5. In the seventh embodiment, a capacitor is used as the direct-current voltage source 1 of the auxiliary voltage applying circuit 5. A resistor is inserted between the gate driving power supply 19 and auxiliary voltage applying circuit 5, thereby not only suppressing the fluctuation of the gate driving power supply 19 but also preventing current from the gate driving power supply 19 from flowing. The semiconductor switch of the seventh embodiment has the same configuration as that of the semiconductor switch of the fourth embodiment except for what has been described above.

In the semiconductor switch of the seventh embodiment, the gate driving power for the main element 1 and auxiliary element 3, the gate driving power for the p-channel MOSFET 12 acting as a miniaturized semiconductor switch, and the power from the direct-current voltage source 11 of the auxiliary voltage applying circuit 5 are all standardized by the gate driving power supply 19, thereby unifying power supplies into one.

That is, with the semiconductor switch of the seventh embodiment, the gate driving power supply 19 shares power with the auxiliary voltage applying circuit 5, enabling the circuit to be simplified.

With the seventh embodiment, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

Next, a semiconductor switch according to an eighth embodiment will be explained with reference to the accompanying drawings.

Figure 13:
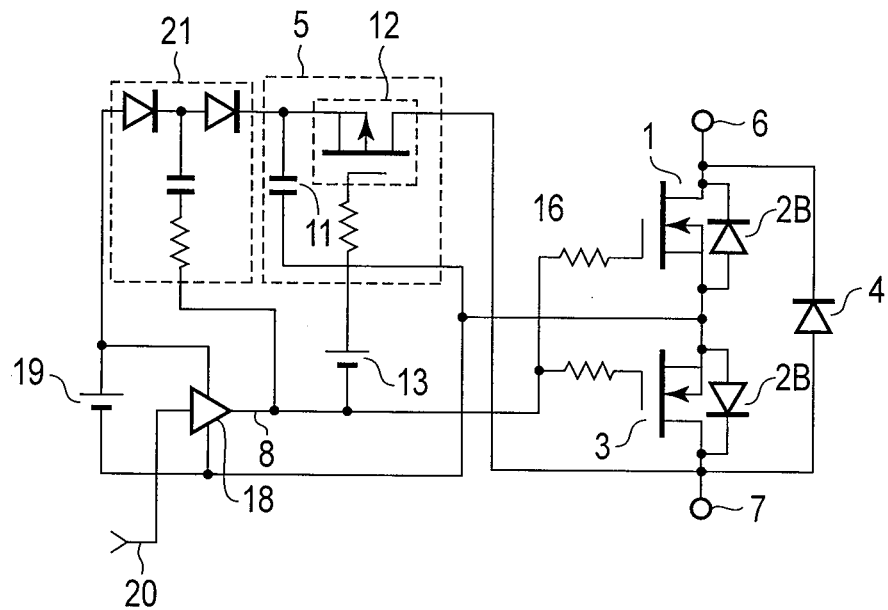
FIG. 13 schematically shows a configuration of a semiconductor switch according to an eighth embodiment.

FIG. 13 is a circuit diagram schematically showing a configuration of a semiconductor switch according to the eighth embodiment. In FIG. 13, a step-up circuit 21 that includes two diodes and a capacitor is inserted in a power supply path from a gate driving power supply 19 to a direct-current voltage source 11 of an auxiliary voltage applying circuit 5. The two diodes are inserted so as to be in series with the power supply path. The capacitor is connected between the connection line between the two diodes and the output line of a gate driving amplifier 18. The step-up circuit 21 steps up the voltage output from the gate driving power supply 19 and outputs the resulting voltage to the direct-current voltage source 11. The semiconductor switch of the eighth embodiment has the same configuration as that of the semiconductor switch of the fourth embodiment except for what has been described above. A resistance for suppressing a charging current and protecting the amplifier is inserted between the capacitor of the step-up circuit 21 and the output line of the gate driving amplifier.

With the semiconductor switch of the eighth embodiment configured as described above, for example, when the gate driving power supply 19 produces 10 V to 15 V, the direct-current voltage source 11 produces about twice 10 V to 15 V, that is, 20 V to 25 V, because it is charged by the capacitor of the step-up circuit 21 and the gate driving voltage source 19. That is, the semiconductor switch of the eighth embodiment enables the voltage of the direct-current voltage source 11 of the auxiliary voltage applying circuit 5 to be raised, making it possible to secure a sufficient voltage for decreasing the output capacitance.

That is, with the semiconductor switch of the seventh embodiment, when the semiconductor switching element is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

With the eighth embodiment, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

Next, a method of driving the main element 1 and auxiliary element 3 in the semiconductor switch of the eighth embodiment will be explained with reference to waveform diagrams.

Figure 14:
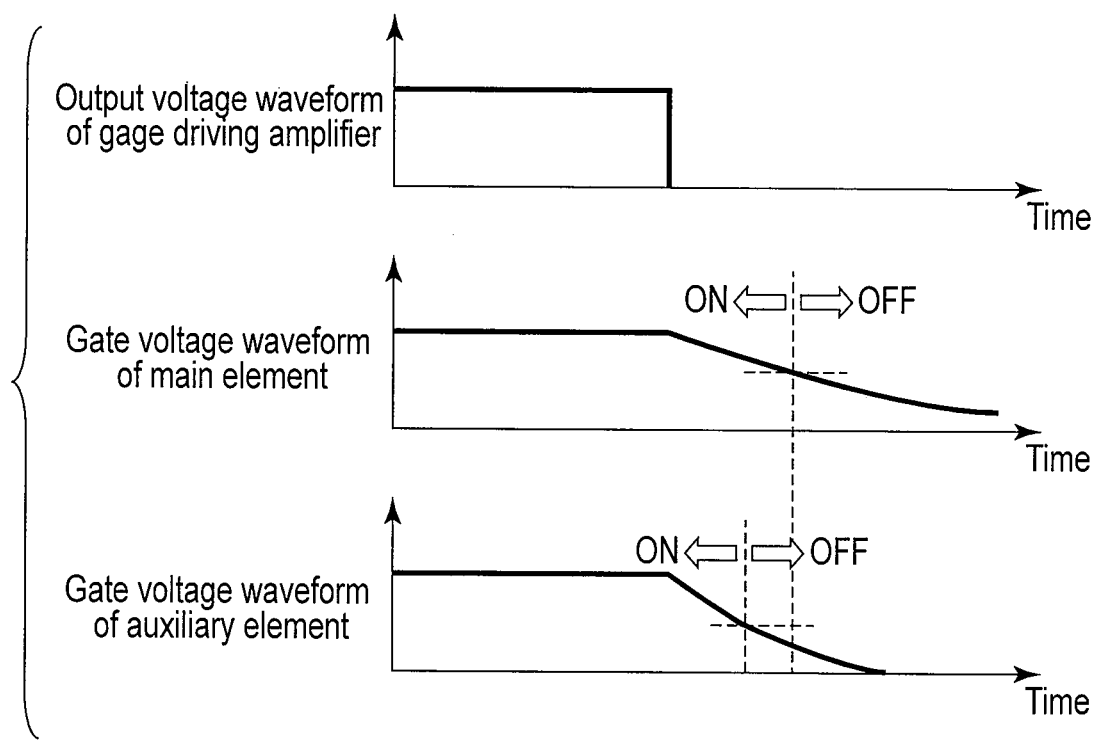
FIG. 14 is a diagram to explain an example of the on/off timing of a main element and a backflow prevention element.

FIG. 14 shows an output voltage waveform of the gate driving amplifier 18, a gate voltage waveform of the main element 1 and that of the auxiliary element 3. FIG. 14 shows a case where the main element 1 and auxiliary element 3 are MOSFETs. In the eighth embodiment, the gate driving voltage of the main element 1 and that of the auxiliary element 3 are output from the same gate driving amplifier (identical driving circuit) 18. Gate resistances acting as control means are inserted so that the instant the main element 1 is turned off may be later the instant the auxiliary element 3 is turned off. Specifically, both of the gate resistances are adjusted so as to make the instant the main element 1 is turned off later the instant the auxiliary element 3 is turned off. That is, the gate resistance of the auxiliary element 3 is lower than that of the main element 1. The control means that performs control so that the instant the main element 1 is turned off may be later the instant the auxiliary element 3 is turned off is not limited to a gate resistance. For instance, a capacitor may be inserted between the gate and source of the main element 1. The timing for turning off the main element 1 can be adjusted by adjusting the capacitance of the capacitor inserted as control means.

Consequently, as shown in the waveform diagrams of FIG. 14, the main element 1 is made later than the auxiliary element 3 in the delay time from the off instruction time for the output voltage waveform of the gate driving amplifier 18. Therefore, the main element 1 is turned off after the auxiliary element 3 is turned off, making it possible to suppress shunt current to the parasitic diode 2B of the main element 1 when shutting off a reverse current. Accordingly, it is possible to suppress extra power supplied from the auxiliary voltage applying circuit 5 of the eighth embodiment to discharge accumulated carriers in the parasitic diode 2B of the MOSFET.

That is, with the semiconductor switch of the eighth embodiment, it is possible to suppress the supply of extra power required for reverse recovery of the parasitic diode 2B of the MOSFET acting as the main element 1.

Next, a semiconductor switch according to a ninth embodiment will be explained with reference to the accompanying drawings.

Figure 15:
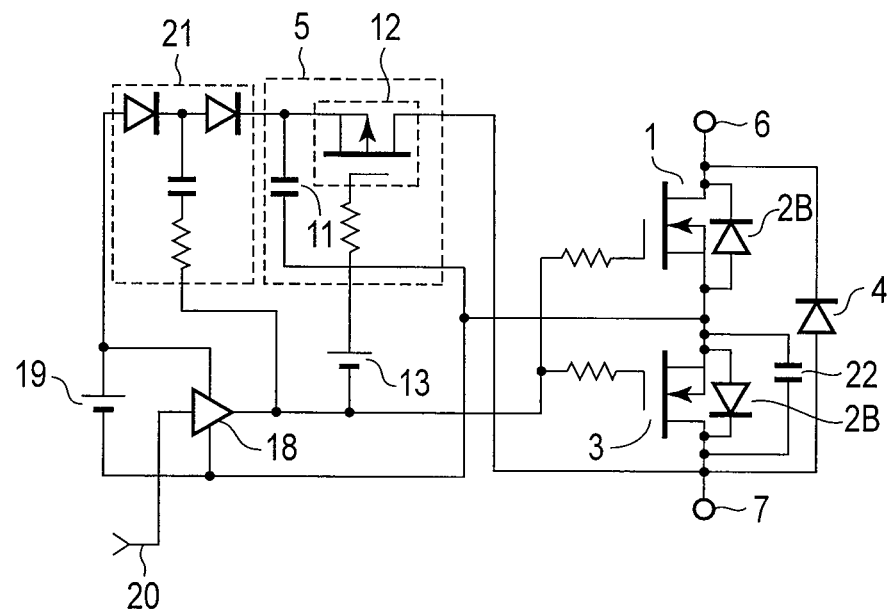
FIG. 15 schematically shows a configuration of a semiconductor switch according to a ninth embodiment.

FIG. 15 is a circuit diagram schematically showing a configuration of a semiconductor switch according to the ninth embodiment. The semiconductor switch of the ninth embodiment further includes a capacitor 22 connected in parallel between the drain terminal and source terminal of the auxiliary element 3. The capacitor 22 preferably has a good high-frequency characteristic, a low inductance (L), and a low resistance (R). The semiconductor switch of the ninth embodiment has the same configuration as that of the semiconductor switch of the eighth embodiment except for what has been described above.

In the semiconductor switch of the ninth embodiment, when a main current is flowing in the opposite direction, that is, in a direction from the negative terminal 7 toward the positive terminal 6, a surge voltage is applied temporarily between the drain and source of the auxiliary element 3 the instant the switching of flows has been completed. As a wiring inductance of a loop of the main element 1, auxiliary element 3, and high-speed free-wheeling diode becomes higher, the surge voltage also increases. In addition, as the main current increases, the surge voltage gets higher. When the output injection capacitance gets lower, the surge voltage becomes higher. Moreover, the surge voltage increases because of a delay time until the forward conduction capability of the high-speed free-wheeling diode 4 has recovered. Furthermore, making lower the gate resistance of the auxiliary element 3 causes the reduction rate of the gate voltage to be increased, resulting in an increase in the surge voltage.

As described above, a surge voltage generated between both ends of the auxiliary element 3 the instant the gate is turned off while the main current is flowing in the opposite direction increases because of various factors. Therefore, in the ninth embodiment, the capacitor 22 is connected across the auxiliary element 3 and charged with the surge voltage, thereby absorbing the surge voltage. At this time, when the voltage charged in the capacitor 22 has been conducted via the high-speed free-wheeling diode 4 and the switching of flows has been completed, this causes a reverse voltage to be applied to the main element 1. As a result, a voltage for achieving complete reverse recovery is applied to the parasitic diode 2B included in the main element 1 that was about to go on momentarily. This enables the reverse recovery of the parasitic diode 2B included in the main element 1 to be completed reliably before the other semiconductor switch operating complementarily is turned on.

That is, the semiconductor switch of the ninth embodiment can suppress a surge voltage generated at the auxiliary element 3, make the chip area of the auxiliary element 3 smaller, and be configured at lower price.

In addition, with the semiconductor switch of the ninth embodiment, the wiring inductance may be higher to some extent and therefore there is no need to take measures to decrease the wiring inductance (e.g., by increasing the number of wiring lines). This makes it possible to configure a semiconductor switch at a lower price.

Moreover, with the semiconductor switch of the ninth embodiment, since there is no need to take into account a surge voltage generated at the auxiliary element 3, the gate resistance of the auxiliary element 3 can be made lower to turn off the gate faster, making the dead time shorter and therefore decreasing the switching loss. As a result, a semiconductor switch capable of high-speed switching can be provided.

Furthermore, the supply of extra power required for reverse recovery of the parasitic diode 2B of the MOSFET acting as the main element 1 can be suppressed.

With the ninth embodiment, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

Next, a semiconductor switch according to a tenth embodiment will be explained with reference to the accompanying drawings.

Figure 16:
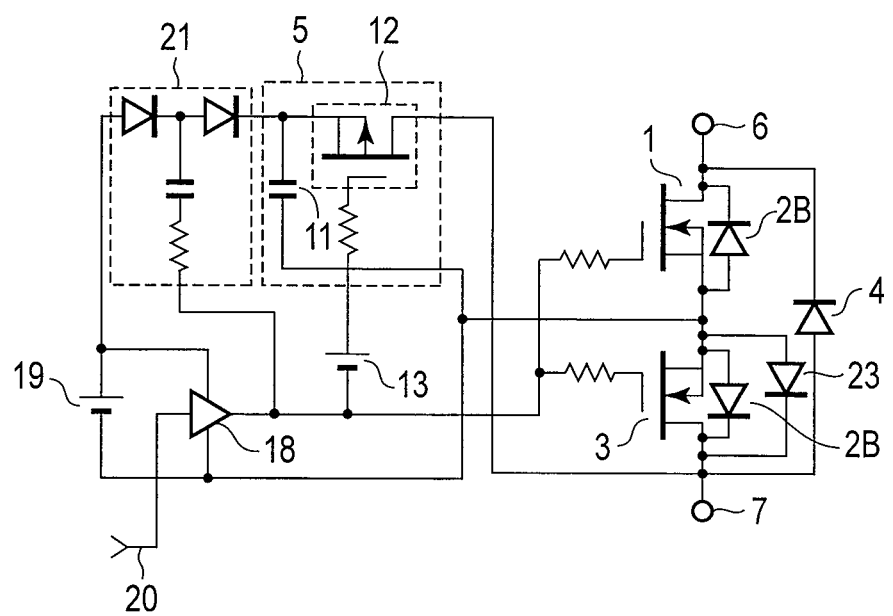
FIG. 16 schematically shows a configuration of a semiconductor switch according to a tenth embodiment.

FIG. 16 is a circuit diagram schematically showing a configuration of a semiconductor switch according to the tenth embodiment. In FIG. 16, an auxiliary diode 23 is connected in parallel to the auxiliary element 3 in a direction from the source terminal to the drain terminal of the auxiliary element 3. A Schottky barrier diode made of silicon semiconductor material is used as the auxiliary diode 23. The semiconductor switch of the tenth embodiment has the same configuration as that of the semiconductor switch of the ninth embodiment except for what has been described above.

In the semiconductor switch of the tenth embodiment, when a main current becomes larger while flowing in the forward direction, the voltage drop can be kept to a low level because the main current is shunted to the auxiliary diode 23 connected in parallel even if the voltage drop has not become sufficiently low only with the conducting resistance of the auxiliary element.

With the semiconductor switch of the tenth embodiment, even when the main current has become larger, the voltage drop can be made smaller and the loss can be decreased. As a result, the allowable maximum current allowed to flow as the main current can be made higher.

With the tenth embodiment, when the semiconductor switch is turned off while the main current is flowing in the opposite direction, the voltage remaining between both ends of the main element 1 is secured to a specific value or more, preventing the output capacitance of the main element 1 from increasing and making it possible to suppress a turn-on power loss caused by a junction capacitance charging current.

Figure 17:
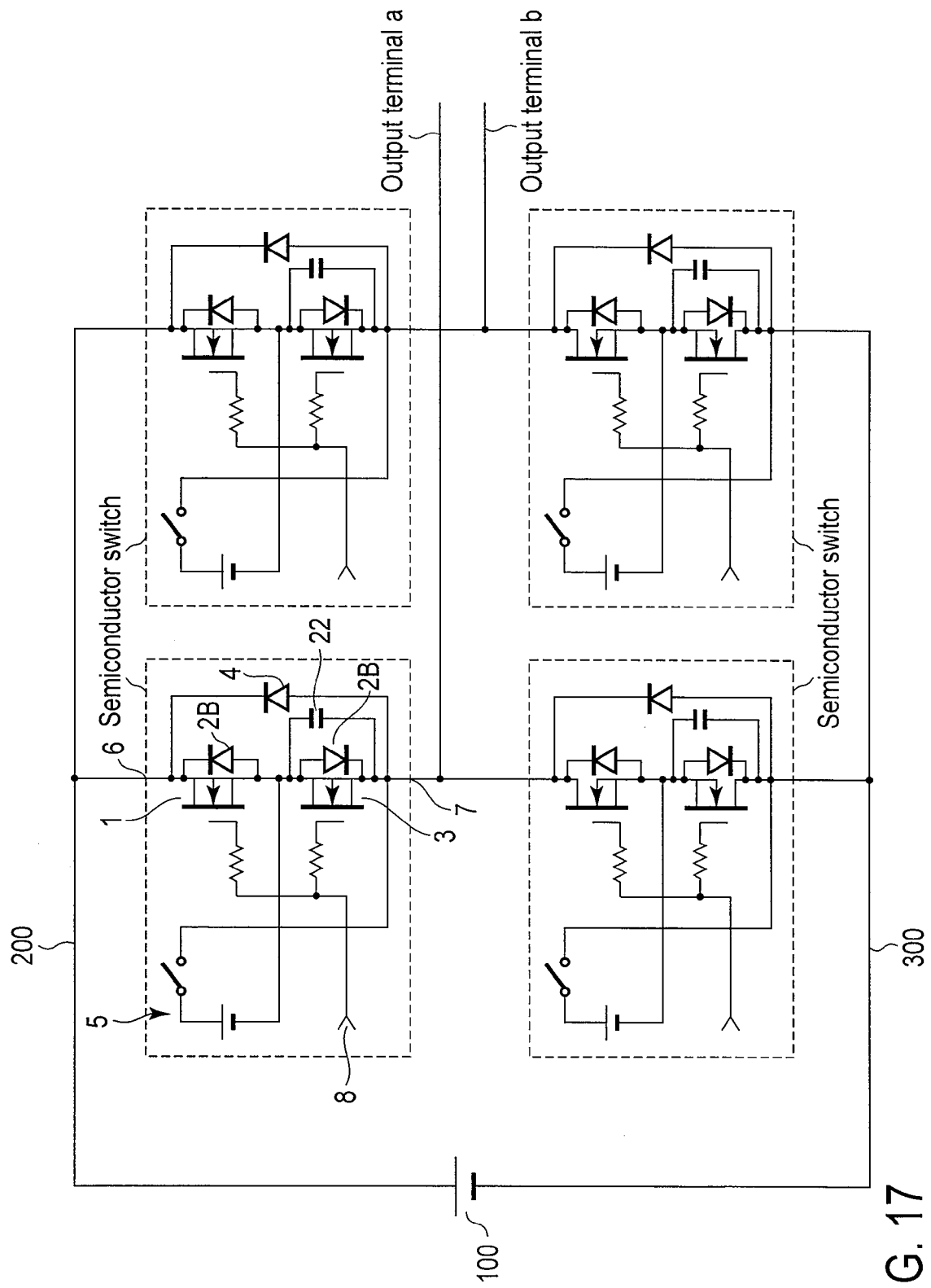
FIG. 17 schematically shows a configuration of a power conversion apparatus according to an embodiment.

FIG. 17 is a circuit diagram showing a circuit configuration of a first power conversion apparatus, a power conversion apparatus to which a semiconductor switch according to an embodiment has been applied.

As shown in FIG. 17, the first power conversion apparatus is a single-phase bridge circuit composed of two units of a bridge composed of two semiconductor switches connected in series between a positive direct-current bus 200 and a negative direct-current bus 300 both extending from a direct-current main power supply 100. A connection point between the positive semiconductor switch and the negative semiconductor switch in one bridge is output terminal a and that in the other bridge is output terminal b.

Any one of the semiconductor switches according to the first to tenth embodiments can be used as the semiconductor switches in FIG. 17. Semiconductor switches obtained by making various omissions, substitutions, and changes in the configurations of the first to tenth embodiments can be used. In the example of FIG. 17, MOSFETs have been applied to the main element 1 and auxiliary element 3. As in the ninth embodiment, a capacitor 22 is further connected in parallel between the drain terminal and source terminal of the auxiliary element 3. As in the third embodiment, an auxiliary voltage applying circuit 5 is composed of a direct-current voltage source 11 and a switch 12 connected in series.

In the first power conversion apparatus configured as described above, semiconductor switches whose conducting voltages are very low and which are capable of high-speed switching are arranged, thereby realizing a high-efficiency (low-loss), inexpensive, high-speed switching power conversion apparatus.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor switch comprising:
a main element which has an inverse conducting capability and is a voltage driving switching element with a high withstand voltage;
a backflow prevention element whose withstand voltage is lower than that of the main element;
a high-speed free-wheeling diode which is connected between a positive terminal and a negative terminal in such a manner that a direction from the negative terminal toward the positive terminal is a forward direction and which has a withstand voltage equal to that of the main element, a negative electrode of the main element and a negative electrode of the backflow prevention element being connected to each other, a positive electrode of the main element being used as the positive terminal, and a positive electrode of the backflow prevention element being used as the negative terminal; and
an auxiliary voltage applying circuit which is connected in a direction in which a positive voltage is applied to the positive electrode of the main element and which generates at least a voltage pulse lower than the withstand voltage of the main element and outputs the voltage pulse almost in synchronization with the time when the main element goes off.

2. The semiconductor switch of claim 1, wherein the backflow prevention element is a voltage driving switching element that goes on and off almost in synchronization with the main element.

3. The semiconductor switch of claim 1, wherein the backflow prevention element is a diode.

4. The semiconductor switch of claim 1, wherein the auxiliary voltage applying circuit is connected in parallel to the backflow prevention element in a direction in which a positive voltage is applied to the positive electrode of the main element via the positive electrode of the backflow prevention element and the high-speed free-wheeling diode and generates a voltage pulse lower than the withstand voltage of the backflow prevention element.

5. The semiconductor switch of claim 1, wherein the auxiliary voltage applying circuit further includes a second diode which is connected in parallel to the main element in such a manner that a direction from the auxiliary voltage applying circuit toward the positive electrode of the main element is a forward direction and has a withstand voltage equal to that of the main element.

6. A semiconductor switch comprising:
a main element which has an inverse conducting capability and is a voltage driving switching element with a high withstand voltage;
a backflow prevention element which is a voltage driving switching element with a withstand voltage lower than that of the main element and which goes on and off at about the same time the main element goes on and off;
a high-speed free-wheeling diode which is connected in parallel between a positive terminal and a negative terminal in such a manner that a direction from the negative terminal toward the positive terminal is a forward direction and which has a withstand voltage equal to that of the main element, a positive electrode of the main element and a positive electrode of the backflow prevention element being connected to each other, a negative electrode of the backflow prevention element being used as the positive terminal, and a negative electrode of the main element being used as the negative terminal; and
an auxiliary voltage applying circuit which is connected in parallel to the backflow prevention element in a direction in which a positive voltage is applied to the positive electrode of backflow prevention element and which generates a voltage pulse lower than the withstand voltage of the backflow prevention element and outputs the voltage pulse almost in synchronization with the time when a gate driving signal of the main element or the backflow prevention element goes off.

7. The semiconductor switch of claim 1 or claim 6, wherein the main element is an Insulated Gate Bipolar Transistor (IGBT).

8. The semiconductor switch of claim 1 or claim 6, further comprising a diode connected in parallel between the positive electrode and negative electrode of the backflow prevention element in such a manner that a direction from the negative electrode toward positive electrode of the backflow prevention element is a forward direction.

9. A power conversion apparatus comprising one or a plurality of units of a bridge circuit composed of two switching elements connected in series with a direct-current main power supply, at least one of the switching elements applied to the power conversion apparatus being a semiconductor switch of claim 1 or claim 6.

10. The semiconductor switch of claim 1 or claim 6, wherein the auxiliary voltage applying circuit includes a direct-current voltage source, an insulating transformer to whose primary circuit the direct-current voltage source is connected, and a backflow prevention diode connected to a secondary circuit of the insulating transformer.

11. The semiconductor switch of claim 1 or claim 6, further comprising a capacitor connected in parallel between the positive electrode and negative electrode of the backflow prevention element.

12. The semiconductor switch of claim 1 or claim 6, wherein the main element has the property of decreasing its output capacitance to $1/10$ or less of the value when no voltage is applied to its output terminal by applying a voltage equal to $1/20$ or less of the withstand voltage of the main element to the output terminal.

13. The semiconductor switch of claim 1 or claim 6, wherein the main element has a high-speed diode connected in parallel between the positive and negative electrodes of the main element in such a manner that a direction from the negative electrode toward positive electrode of the main element is a forward direction.

14. The semiconductor switch of claim 1 or claim 6, wherein the auxiliary voltage applying circuit includes a direct-current voltage source and a semiconductor switch element connected in series with the direct-current voltage source.

15. The semiconductor switch of claim 14, wherein the semiconductor switch element is a p-channel MOSFET.

16. The semiconductor switch of claim 8, wherein the backflow prevention element is a voltage driving switching element, and
   the direct-current voltage source of the auxiliary voltage applying circuit is supplied from the gate driving power supply of the main element or the backflow prevention element.

17. The semiconductor switch of claim 16, further comprising a step-up circuit provided in a power supply path from the gate driving power supply of the main element or the backflow prevention element to the direct-current voltage source of the auxiliary voltage applying circuit.

\* \* \* \* \*